(12) United States Patent
Bauer et al.

(10) Patent No.: US 7,190,077 B2
(45) Date of Patent: Mar. 13, 2007

(54) SEMICONDUCTOR STRUCTURE INTEGRATED UNDER A PAD

(75) Inventors: Robert Bauer, Moosach (DE); Werner Ertle, Neubiberg (DE); Till Frohnmüller, München (DE); Bernd Goller, Otterfing (DE); Reinhard Greiderer, München (DE); Oliver Nagler, München (DE); Olaf Schmeckebier, München (DE); Wolfgang Stadler, München (DE)

(73) Assignee: Infineon Technologies AG (DE)

( * ) Notice: Subject to any disclaimer, the term of this patent is extended or adjusted under 35 U.S.C. 154(b) by 246 days.

(21) Appl. No.: 10/519,860

(22) PCT Filed: Jun. 12, 2003

(86) PCT No.: PCT/DE03/01955

§ 371 (c)(1),
(2), (4) Date: Dec. 29, 2004

(87) PCT Pub. No.: WO2004/004002

PCT Pub. Date: Jan. 8, 2004

(65) Prior Publication Data
US 2005/0242374 A1    Nov. 3, 2005

(30) Foreign Application Priority Data
Jul. 1, 2002    (DE) ............................ 102 29 493

(51) Int. Cl.
*H01L 23/48*    (2006.01)
*H01L 23/52*    (2006.01)
*H01L 29/40*    (2006.01)

(52) U.S. Cl. .................. 257/762; 257/758; 257/774; 257/778

(58) Field of Classification Search ............... 257/762, 257/758, 774, 778
See application file for complete search history.

(56) References Cited

U.S. PATENT DOCUMENTS

| 5,751,065 | A * | 5/1998 | Chittipeddi et al. | ......... 257/758 |
| 2001/0010408 | A1 * | 8/2001 | Ker et al. | ............. 257/781 |
| 2004/0266183 | A1 * | 12/2004 | Miller et al. | ............. 438/687 |

FOREIGN PATENT DOCUMENTS

EP    1 143 513 A1    10/2001

OTHER PUBLICATIONS

International Search Report from corresponding PCT application No. PCT/DE2003/001955.
Preliminary Examination Report from corresponding PCT application No. PCT/DE2003/001955.

* cited by examiner

*Primary Examiner*—Andy Huynh
*Assistant Examiner*—Tram H. Nguyen
(74) *Attorney, Agent, or Firm*—Brinks Hofer Gilson & Lione

(57)    ABSTRACT

An integrated semiconductor structure has a substrate, a semiconductor element located on the substrate, a pad metal, metal layers located between the pad metal and the substrate, and insulation layers that separate the metal layers from one another. The pad metal extends over at least—part of the semiconductor element.

Figure 1:
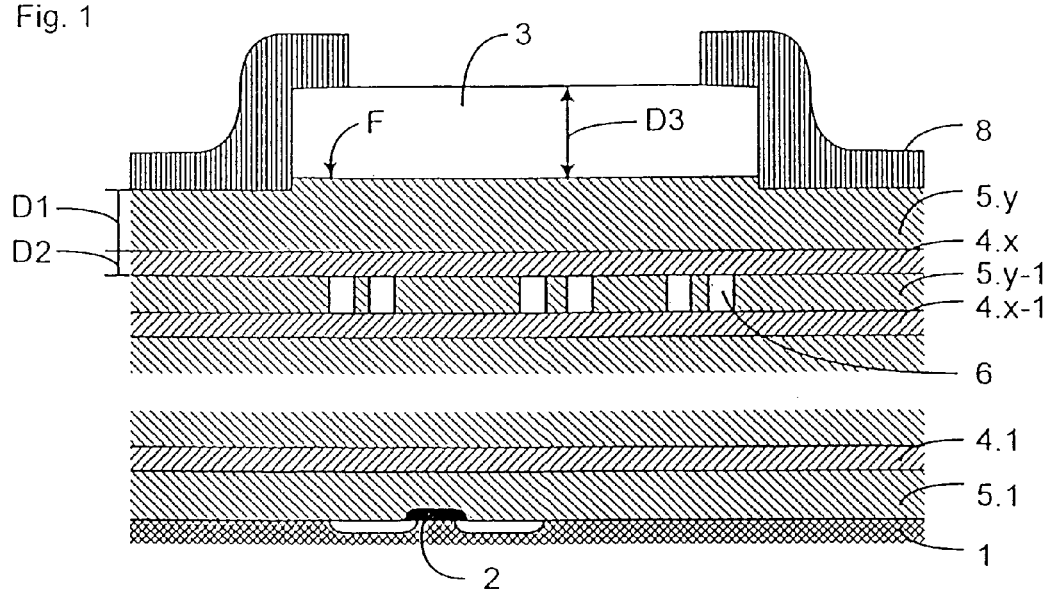

Below the surface of the pad metal, at least the top two metal layers include two or more adjacent interconnects.

18 Claims, 2 Drawing Sheets

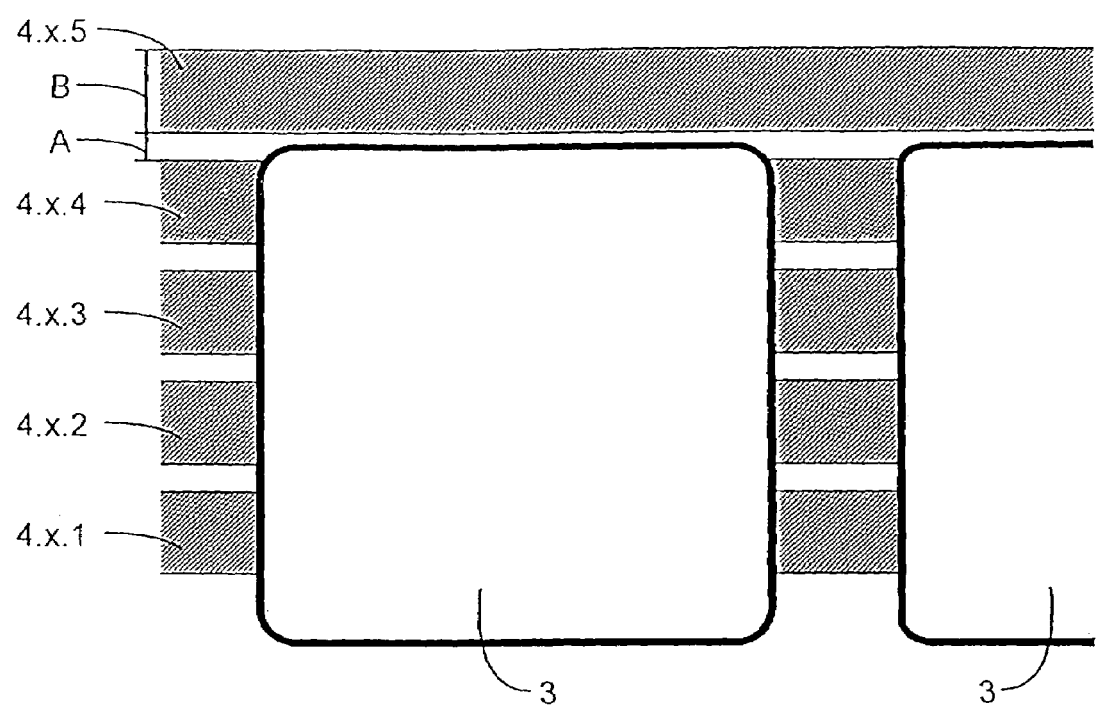

SEMICONDUCTOR STRUCTURE INTEGRATED UNDER A PAD

This application is the national stage application of international application number PCT/DE2001/001955, filed Jun. 12, 2003, which claims the benefit of priority to German Patent Application De 102 29 493.3, filed on Jul. 1, 2002, both of which are incorporated herein by reference.

The invention relates to an integrated semiconductor structure, having a substrate, at least one semiconductor element located on the substrate, a pad metal having a surface, a multiplicity of metal layers which are located between the pad metal and the substrate, and a multiplicity of insulation layers, which separate the metal layers from one another, the pad metal extending at least over part of the at least one semiconductor element.

A semiconductor structure of this type is known, for example, from U.S. Pat. No. 6,207,547.

An important aspect in the fabrication of integrated semiconductor structures is the electrical contacting (bonding) of the semiconductor elements which are located within the semiconductor structure. In this case, the electrical contact between housing contacts (PINs) and the semiconductor elements is produced via contact islands. The contact islands are metallic regions (pad metal) which can be electrically connected to the semiconductor elements and metal layers. On account of the bonding processes which are currently used, the pad metals are of a relatively large size in the semiconductor structure compared to the dimensions of the semiconductor elements below. The pad metal therefore covers a significant part of the surface of a chip, and consequently the region which lies below the pad metal forms a significant proportion of the volume of the chip.

During bonding of the semiconductor structure, a high mechanical load is exerted on the pad metal. This load brings with it the risk of structures disposed beneath the pad metal being damaged. For example, the top insulation layer, which runs directly beneath the pad metal, may become cracked, leading to leakage currents on account of the passivation of the semiconductor structure being damaged. Secondly, the semiconductor elements, for example active structures, such as MOS transistors, which have a relatively thin gate oxide, must under all circumstances be protected from excessive pressure for reasons of reliability. Therefore, previously semiconductor elements have not been positioned beneath the pad metal, in order to avoid damage. This means that an extremely large loss of chip area has to be accepted.

EP 1 017 098 A2 proposes a combination of a stress-absorbing metal layer and a mechanically reinforced electrical insulation layer, as well as a sufficient thickness of these two layers, so that at least part of the semiconductor element may extend directly beneath the pad metal. However, this only slightly reduces the area taken up on the chip surface.

It is known from U.S. Pat. No. 6,207,547, which was mentioned in the introduction, to introduce a structured intermediate layer between pad metal and top metal level in order to stabilize and protect the active circuits below. The result of this is that structures with gate oxide, for example MOS transistors, can be positioned directly below the pad metal. However, the production of a structured intermediate layer of this type requires a specially modified and complicated production process.

Therefore, it is an object of the present invention to propose a semiconductor structure which allows a simplified production process to be used without there being any restriction with regard to the use of semiconductor elements which may be positioned beneath the pad metal.

According to the invention, the object is achieved by an integrated semiconductor structure of the type described in the introduction in which, below the surface of the pad metal, at least the top two metal layers have a structure which in each case at least includes two adjacent interconnects.

The invention is based on the discovery that a damping and stabilizing structure can be formed by using a suitable arrangement (layout) of the top two metal levels lying directly beneath the pad metal without the fabrication process for the integrated semiconductor structure having to be altered. Furthermore, the inventors have discovered that on account of the increased stability of this semiconductor structure any type of semiconductor element can be arranged beneath the surface of the pad metal.

Contrary to designs which have long been known, the interconnects of the present invention can be electrically utilized and are not used just to increase stability. For example, the interconnects running beneath the pad metal are connected to one or different potentials on the semiconductor structure. The interconnects of the top metal layer are typically used as supply lines for semiconductor elements (e.g. transistors) below.

Depending on the technology used, the number of metal layers may be between 3 and 11, for example between 4 and 8 metal layers are currently used for the 0.13 µm CMOS technology generation.

A configuration of the integrated semiconductor structure according to the invention provides for the number of interconnects, within a metal layer, at least below the surface of the pad metal, to be between 2 and 6, depending on the size and extent of this pad metal.

According to the invention, the interconnects within a metal layer may be electrically insulated from one another.

In a further development, the interconnects within a metal layer are electrically connected to one another. Furthermore, if there are more than two interconnects below the surface of the pad metal, individual interconnects within a metal layer can be electrically insulated from the other interconnects, the remaining interconnects being electrically connected to one another.

It is also conceivable for structures, known as dummy structures, which have purely a stabilizing function but are not electrically connected to any potential, to be incorporated at least in small regions below the surface of the pad metal. However, this design leads to a loss of electrically usable area.

A further advantageous configuration which shields the structures located beneath the pad metal from the mechanical load provides for the interconnects to be designed to be sufficiently wide and to be at relaxed spacings from one another. According to the invention, the ratio between the width of the interconnects and the spacing between them is between 3 and 20, preferably 10. At least the top two metal layers are therefore designed as wide interconnects in order to achieve a damping effect without requiring any unnecessary procedures.

In a particularly advantageous further development of the integrated semiconductor structure according to the invention, at least below the surface of the pad metal there is a multiplicity of vias which electrically connect the interconnects of the top metal layer to the interconnects of the metal layer below, the vias penetrating vertically through the insulation layer between the top two metal layers. This firstly ensures that the semiconductor element still functions even in the event of a short circuit occurring between these metal layers, as may occur as a result of mechanical pressure. Secondly, the vias further stabilize the integrated semiconductor structure.

Optimized stabilizing and damping can be achieved by suitable formation of the vias. It is preferable for a relatively large number of vias between the top two metal layers to be distributed beneath the surface of the pad metal, the vias being arranged in series with one another or offset with respect to one another. In this way, any pressure which occurs is distributed over the largest possible area.

Another advantageous development of the integrated semiconductor structure according to the invention provides for the interconnects of the top two metal layers to have a multiplicity of apertures at least below the surface of the pad metal. These apertures may be filled with the same material as the material which forms the insulation layers, such as for example silicon dioxide or silicon nitride. This too additionally stabilizes the semiconductor structure.

In another further development of the integrated semiconductor structure according to the invention, the apertures, at least below the surface of the pad metal, have a total area of between 5% and 30% of the total area of the interconnects. The apertures preferably form 20% of the interconnects.

According to the invention, the stability of the integrated semiconductor structure with respect to pressures which occur is also increased by the interconnects of the top two metal layers being arranged in such a manner with respect to one another that the apertures in the top interconnects are offset with respect to the apertures in the interconnects below. This offset arrangement ensures a high degree of damping.

In another embodiment of the integrated semiconductor structure according to the invention, the interconnects of the top metal layer lie approximately congruently above the interconnects of the metal layer below.

The interconnects of the top metal layer are preferably offset with respect to the interconnects of the metal layer below. This results in a very effective damping structure being formed. The lateral offset between the interconnects may in this case be at its maximum, in which case therefore two adjacent interconnects of a metal layer are partially covered by, for example, the interconnect above.

A further advantageous configuration of the integrated semiconductor structure provides for the metal layers, at least for the most part, to be made from a sufficiently hard metal. This makes it possible to prevent the thickness of the metal layers from being reduced under mechanical load or to prevent the insulation layer located above the metal layer from being pushed through to the insulation layer below under mechanical load.

The metal is typically copper, aluminum, tungsten, molybdenum, silver, gold, platinum or alloys thereof.

In another refinement, the surface of the pad metal covers a region which, within a metal layer, comprises at least 50% metal. These preferably include the metallic regions of the interconnects (without apertures), but also additionaly introduced metallic dummy structures.

For a particularly stable configuration of the integrated semiconductor structure, the metal is distributed uniformly below the surface of the pad metal. Therefore, the interconnects which consist of metal and the apertures within the interconnects and also the electrical connection between adjacent interconnects are preferably distributed uniformly beneath the surface of the pad metal.

There is preferably a top insulation layer between the pad metal and the top metal layer, the top insulation layer having a first thickness D1 and the top metal layer having a second thickness D2, and the ratio between the two thicknesses D1 and D2 being between 1 and 5. This reduces the risk of cracks forming in the top insulation layer and therefore provides increased protection for the semiconductor elements below.

Another development of the integrated semiconductor structure according to the invention provides for the top insulation layer to have a thickness D1 and for the pad metal to have a thickness D3, and for the ratio between the two thicknesses D1 and D3 to be between 0.5 and 3.

Figure 2:
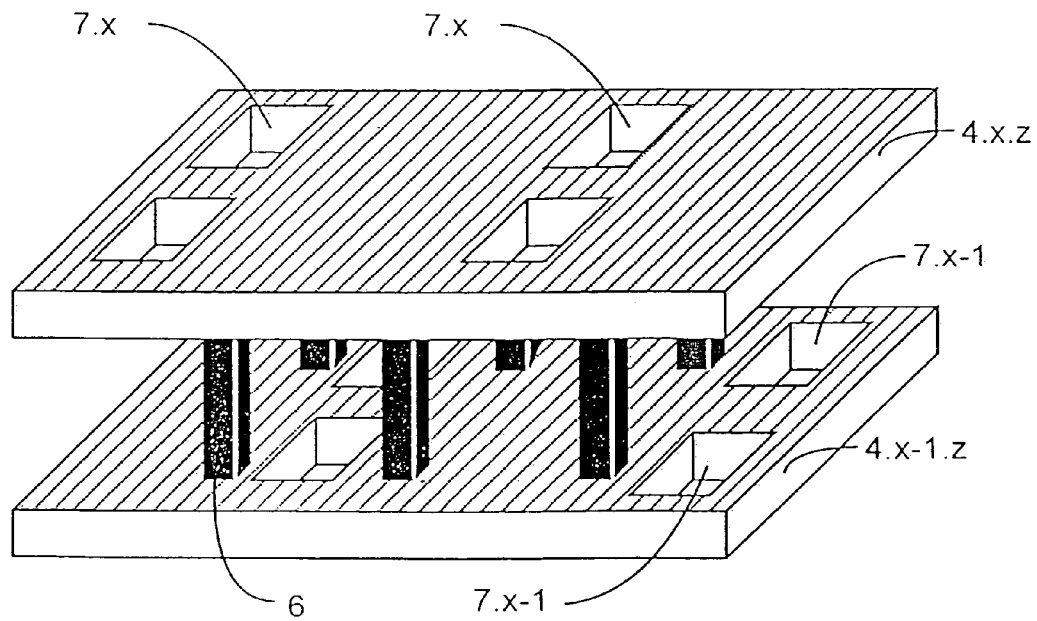

The invention is described in more detail below with reference to the figures, in which:

FIG. 1 shows a cross section through an exemplary embodiment of an integrated semiconductor structure according to the invention, FIG. 2 shows part of the interconnects of the top two metal layers from FIG. 1, in a perspective illustration, FIG. 3 shows a plan view of an integrated semiconductor structure according to the invention with a pad metal and interconnects.

The semiconductor structure includes a pad metal 3 having a surface F and a thickness D3, for example a thick layer of aluminum, a passivation layer 8, a substrate 1, a semiconductor element 2, for example a transistor 2, positioned on the substrate 1 the transistor 2 being arranged beneath the surface F of the pad metal 3, a multiplicity of metal layers 4.$x$, and a multiplicity of insulation layers 5.$y$ which separate the metal layers 4.$x$ from one another. For the sake of clarity, FIG. 1 diagrammatically depicts only the first and top two metal layers 4.1, 4.$x$-1 and 4.$x$; depending on the technology used, currently up to 11 metal layers 4.$x$ may be arranged above one another.

To form a shield with respect to the mechanical pressure which is produced bonding or testing of the integrated semiconductor structure, both the pad metal 3 and the top insulation layer 5.$y$, which is located directly beneath the pad metal 3, are designed to be sufficiently thick. The insulation layer 5.$y$ preferably has a thickness D1 which is between one and five times as thick as the thickness D2 of the top metal layer 4.$x$ and is between 0.5 and three times as thick as the thickness D3 of the pad metal 3.

The top two metal layers 4.$x$ and 4.$x$-1 are separated from one another by an insulation layer 5.$y$-1. The vias 6 penetrate vertically through this insulation layer 5.$y$-1 and electrically connect the top metal layer 4.$x$ to the metal layer 4.$x$-1 below. Particularly in the region below the surface F of the pad metal 3 there is a multiplicity of vias 6 between the two metal layers 4.$x$ and 4.$x$-1. These configurations provide sufficient protection for the transistor 2 with respect to mechanical loads which occur.

FIG. 2 shows a perspective illustration of part of the integrated semiconductor structure according to the invention in the region of the top two metal layers directly below the surface of the pad metal. Both the interconnect 4.$x$.$z$ of the top metal layer and the interconnect 4.$x$-1.$z$ of the metal layer below have apertures 7.$x$ and 7.$x$-1. The apertures 7.$x$ in the interconnects 4.$x$.$z$ are arranged offset with respect to the apertures 7.$x$-1 of the interconnect 4.$x$-1.$z$ below. The apertures 7.$x$ and 7.$x$-1 therefore do not lie directly above one another. Furthermore, the two interconnects 4.$x$.$z$ and 4.$x$-1.$z$ are electrically connected to one another via vertically running vias 6. To ensure the maximum possible stability with respect to pressures, as many vias 6 as possible are arranged in particular in the region beneath the pad metal.

Other arrangements of apertures 7.x and vias 6 can be provided by one of skill in the art.

FIG. 3 shows a plan view of the integrated semiconductor structure according to the invention with a pad metal 3 and an adjoining pad metal 3. Four interconnects 4.x.1 to 4.x.4 run in the region beneath the pad metals 3. The fifth interconnect 4.x.5 runs outside the region of the pad metals 3. The spacings A between the individual interconnects 4.x.z and their width B are clearly shown. Semiconductor elements, such as transistors or diodes, likewise lie beneath the surface of the pad metal 3 but are not visible in FIG. 3.

A suitable damping and stabilizing structure is provided which enables any type of electrical semiconductor elements to be arranged beneath the surface of the pad metal without there being any risk of damage to these semiconductor elements in the event of pressure being applied. This pressure can occur, for example, during bonding or testings. The structure is achieved without expensive process changes or without the need for additional process features to be added. Furthermore, it is now possible to utilize the region beneath the surface of the pad metal, for example, for power supply tracks

The invention claimed is:

1. An integrated semiconductor structure, having
a substrate,
at least one semiconductor element located on the substrate,
a pad metal having a surface,
a multiplicity of metal layers which are located between the pad metal and the substrate, and
a multiplicity of insulation layers, which separate the metal layers from one another,
the pad metal extending at least over part of the at least one semiconductor element,
wherein, below the surface of the pad metal, at least the top two metal layers have a structure which in each case at least includes two adjacent interconnects,
at least below the surface of the pad metal, the interconnects of the top two metal layers have a multiplicity of apertures, and
the interconnects of the top two metal layers are arranged in such a manner with respect to one another that the apertures in the top interconnects are offset with respect to the apertures in the interconnects below.

2. The integrated semiconductor structure as claimed in the preceding claim 1, wherein the number of the interconnects of a metal layer, beneath the surface of the pad metal, is between 2 and 6.

3. The integrated semiconductor structure as claimed in claim 1, wherein the interconnects within a metal layer are electrically insulated from one another.

4. The integrated semiconductor structure as claimed in claim 1, wherein the interconnects within a metal layer are electrically connected to one another.

5. The integrated semiconductor structure as claimed in claim 1, wherein the interconnects within a metal layer have a width and are at a spacing from one another, the ratio between the width and the spacing being between 3 and 20.

6. The integrated semiconductor structure as claimed in claim 5, wherein the ratio between the width and the spacing is 10.

7. The integrated semiconductor structure as claimed in claim 1, wherein, at least below the surface of the pad metal, there is a multiplicity of vias which electrically connect the interconnects of the top metal layer to the interconnects of the metal layer below the top metal layer, the vias penetrating through the insulation layer between the top metal layer and the metal layer below the top metal layer.

8. The integrated semiconductor structure as claimed in claim 1, wherein, at least below the surface of the pad metal, the apertures have a total area of between 5% and 30% of the total area of the interconnects.

9. The integrated semiconductor structure as claimed in claim 8, wherein the apertures have a total area of 20% of the total area of the interconnects.

10. The integrated semiconductor structure as claimed in claim 1, wherein the interconnects of the top metal layer lie approximately congruently above the interconnects of the metal layer below.

11. The integrated semiconductor structure as claimed in claim 1, wherein the interconnects of the top metal layer are offset with respect to the interconnects of the metal layer below.

12. The integrated semiconductor structure as claimed in claim 1, wherein the metal layers, at least for the most part, are made from a sufficiently hard metal.

13. The integrated semiconductor structure as claimed in claim 12, wherein the metal contains aluminum, copper, tungsten, molybdenum, silver, gold, platinum or alloys thereof.

14. The integrated semiconductor structure as claimed in claim 1, wherein the surface of the pad metal covers a region which, within a metal layer, comprises at least 50% metal.

15. The integrated semiconductor structure as claimed in claim 14, wherein the metal is distributed uniformly beneath the surface of the pad metal.

16. The integrated semiconductor structure as claimed in claim 1, wherein a top insulation layer is provided between the pad metal and the top metal layer, the top insulation layer having a first thickness and the top metal layer having a second thickness, and the ratio between the two thicknesses being between 1 and 5.

17. The integrated semiconductor structure as claimed in claim 1, wherein a top insulation layer is provided between the pad metal and the top metal layer, the top insulation layer having a first thickness and the pad metal having a further second thickness, and the ratio between the two thicknesses being between 0.5 and 3.

18. The integrated semiconductor structure as claimed in claim 1, wherein the number of the metal layers is between 3 and 11.

* * * * *